United States Patent
Toda et al.

(10) Patent No.: US 7,662,311 B2
(45) Date of Patent: Feb. 16, 2010

(54) FLUORESCENT SUBSTANCE FOR LIGHT-EMITTING DIODE

(75) Inventors: Kenji Toda, Niigata (JP); Mineo Sato, Niigata (JP); Kazuyoshi Uematsu, Niigata (JP); Shinichiro Kousaka, Niigata (JP); Yoshitaka Kawakami, Niigata (JP)

(73) Assignee: Niigata University, Niigata (JP)

( * ) Notice: Subject to any disclaimer, the term of this patent is extended or adjusted under 35 U.S.C. 154(b) by 326 days.

(21) Appl. No.: 11/575,386

(22) PCT Filed: Apr. 4, 2006

(86) PCT No.: PCT/JP2006/007139

§ 371 (c)(1),
(2), (4) Date: Mar. 15, 2007

(87) PCT Pub. No.: WO2007/029369

PCT Pub. Date: Mar. 15, 2007

(65) Prior Publication Data

US 2009/0085009 A1   Apr. 2, 2009

(30) Foreign Application Priority Data

| Sep. 6, 2005 | (JP) | ............... 2005-257956 |
| Sep. 6, 2005 | (JP) | ............... 2005-257957 |
| Sep. 6, 2005 | (JP) | ............... 2005-257958 |

(51) Int. Cl.
*C09K 11/59* (2006.01)
*C09K 11/55* (2006.01)

(52) U.S. Cl. .................. 252/301.4 F; 252/301.4 R

(58) Field of Classification Search .......... 252/301.4 F, 252/30.4 R, 301.4 R
See application file for complete search history.

(56) References Cited

U.S. PATENT DOCUMENTS 6,555,958 B1    4/2003   Srivastava et al.

FOREIGN PATENT DOCUMENTS

| DE | 10319091 | 9/2004 |
| JP | 58-168683 | 10/1983 |

(Continued)

OTHER PUBLICATIONS

International Search Report for PCT/JP2006/307139 mailed Jun. 13, 2006.

(Continued)

*Primary Examiner*—C. Melissa Koslow
(74) *Attorney, Agent, or Firm*—Darby & Darby PC

(57) ABSTRACT

A novel fluorescent substance for a light-emitting diode, emitting light of any one of three primary colors by excitation of an ultraviolet light-emitting diode. Alternatively, a novel fluorescent substance for a light-emitting diode, emitting light in a red region of a spectrum by excitation of a blue light-emitting diode. $Na_2SrSi_2O_6$ is doped with $Eu^{3+}$. Preferably, $Eu^{3+}$ is added so as to account for 1 to 80 mol % in concentration in a host crystal, while sites of $Si^{4+}$ in $Na_2SrSi_2O_6$ are replaced by $Al^{3+}$ and/or $Ga^{3+}$. Alternatively, $Ca_3Si_2O_7$ is doped with $Ce^{3+}$ and $Tb^{3+}$. Preferably, $Ce^{3+}$ and $Tb^{3+}$ are added so as to account for 0.1 to 80 mol % and 0.1 to 20 mol % in concentration in a host crystal, respectively. Still alternatively, $Ca_3Si_2O_7$ is doped with $Eu^{2+}$. Preferably, $Eu^{2+}$ is added so as to account for 0.5 to 10 mol % in concentration in the host crystal.

4 Claims, 2 Drawing Sheets

FOREIGN PATENT DOCUMENTS

| | | |
|---|---|---|
| JP | 60-141781 | 7/1985 |
| JP | 2003-105336 | 4/2003 |
| JP | 2005-64272 | 3/2005 |
| JP | 2005-126577 | 5/2005 |

OTHER PUBLICATIONS

"Effect of charge compensators on synthesis and luminescence of Eu (III)-activated phosphors", by Liu, Zuwu; Tie Shaolong, Xiangtan Daxue Ziran Kexue Xuebao (1992), 14(4), pp. 6-11., Chemical Abstracts, vol. 120, No. 283460 (1994).(RN: 154875-32-8).

FLUORESCENT SUBSTANCE FOR LIGHT-EMITTING DIODE

CROSS-REFERENCE TO PRIOR APPLICATION

This is a U.S. National Phase Application under 35 U.S.C. §371 of International Patent Application No. PCT/US2006/307139 filed Apr. 4, 2006, and claims the benefit of Japanese Patent Applications No. 2005-257956, filed Sep. 6, 2005, 2005-257957, filed Sep. 6, 2005 and 2005-257958, filed Sep. 6, 2005, all of which are incorporated by reference herein. The International Application was published in Japanese on Mar. 15, 2006 as WO 2006/029369 A1 under PCT Article 21(2).

TECHNICAL FIELD

The present invention relates to a fluorescent substance for light-emitting diode.

BACKGROUND ART

Due to excellent properties such as low electric-power consumption and longer operating life, a light-emitting diode has been brought into service as a luminous source such as a traffic signal, a lighting apparatus or the like. Then, a white light-emitting diode produced by combining a blue light-emitting diode and a yellow light emitter YAG:$Ce^{3+}$ has been developed and therefore studies on a high-power visible light-emitting diode are underway in many fields (e.g., see Japanese unexamined patent application publication No. 2003-105336).

Problems to be Solved by the Invention

A luminescent color of the YAG:$Ce^{3+}$ is, however, green-tinged yellow and hence when YAG:$Ce^{3+}$ is excited by the blue light-emitting diode, only cool white light with a high color temperature is obtained.

Consequently, a method for obtaining white light with a high color rendition by combining fluorescent substances with luminescent colors of blue, green and red, the three primary colors, caused by the excitation of an ultraviolet light-emitting diode is under study. Thus, a new fluorescent substance for the light-emitting diode has been demanded. Alternatively, in order to improve the color rendition of a white light-emitting diode using the blue light-emitting diode, a fluorescent substance for emitting light in the red region of the spectrum has been required to be mixed.

In view of the problems described above, it is, therefore, an object of the present invention to provide a novel fluorescent substance for a light-emitting diode which emits light of any one of the three primary colors by excitation of an ultraviolet light-emitting diode. It is another object of the present invention to provide a novel fluorescent substance for a light-emitting diode which emits light in the red region of the spectrum by excitation of a blue light-emitting diode.

Means for Solving the Problems

As a result of various studies made to solve the problems described above, it has been found out by the present inventors that by doping $Na_2SrSi_2O_6$ with $Eu^{3+}$ excitation light in the near-ultraviolet light region of the spectrum causes emission of red light. Further, it has been found out that by doping $Ca_3Si_2O_7$ with $Ce^{3+}$ and $Tb^{3+}$, excitation light in the near-ultraviolet light region of the spectrum causes emission of green light. Furthermore, it has been found out that by doping $Ca_3Si_2O_7$ with $Eu^{2+}$, excitation light in the visible light range of the spectrum causes emission of red light. Thus, the present invention has been completed.

Namely, the fluorescent substance for a light-emitting diode according to the present invention is characterized by doping $Na_2SrSi_2O_6$ with $Eu^{3+}$.

Further, the fluorescent substance for a light-emitting diode according to the present invention is characterized by doping $Ca_3Si_2O_7$ with $Ce^{3+}$ and $Tb^{3+}$.

Furthermore, the fluorescent substance for a light-emitting diode according to the present invention is characterized by doping $Ca_3Si_2O_7$ with $Eu^{2+}$.

EFFECTS OF THE INVENTION

According to the present invention, there can be provided a novel fluorescent substance for a light-emitting diode which emits light in the red region of the spectrum by excitation of an ultraviolet light-emitting diode.

Further, according to the present invention, there can be provided a novel fluorescent substance for light-emitting diode which emits light in the green region of the spectrum by excitation of an ultraviolet light-emitting diode.

Furthermore, according to the present invention, there can be provided a novel fluorescent substance for light-emitting diode which emits light in the red region of the spectrum by excitation of a blue light-emitting diode.

BRIEF DESCRIPTION OF ATTACHED DRAWINGS

FIG. 1 is a chart of a powder X-ray diffraction of $Na_2SrSi_2O_6$:$Eu^{3+}$ according to the present invention, in which the uppermost graph shows the one obtained by a simulation based on a crystal structure of $Na_2SrSi_2O_6$, while an intermediate graph shows the one obtained by baking an $Eu^{3+}$-doped one at 900 degrees C., and the lowermost graph shows the one obtained by baking an $Eu^{3+}$-doped one at 950 degrees C., respectively.

BEST MODE FOR CARRYING OUT THE INVENTION

Figure 1:
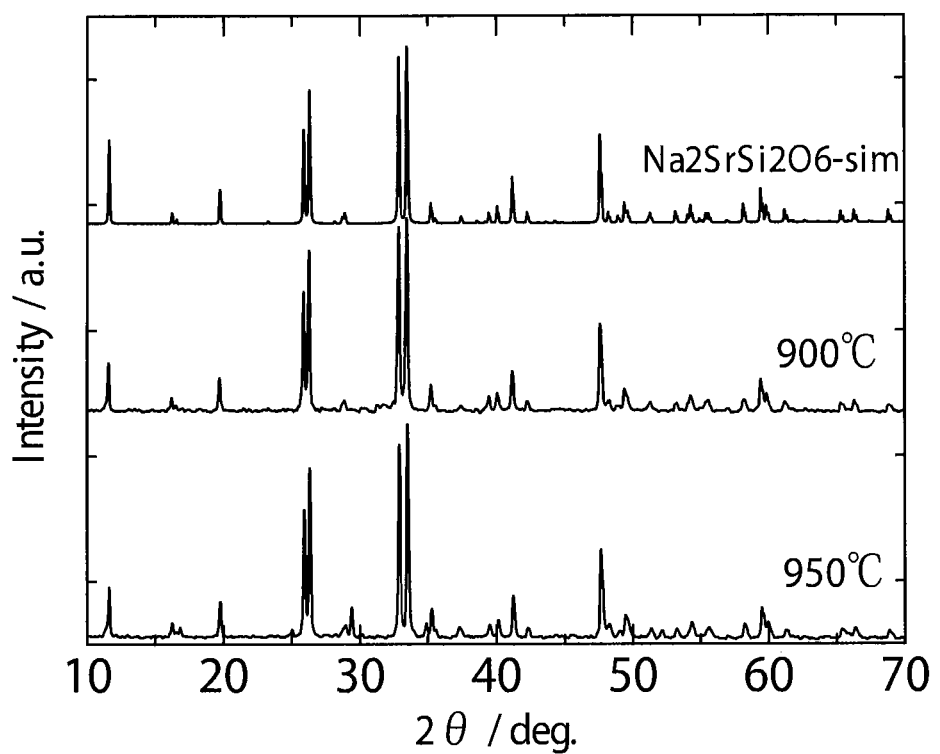

Hereunder is a description of a fluorescent substance for a light-emitting diode according to the present invention.

Embodiment 1

A first fluorescent substance for light-emitting diode according to the present invention is produced by doping $Na_2SrSi_2O_6$ with $Eu^{3+}$.

It is preferable that $Eu^{3+}$ is added so as to have a concentration of 1 to 80 mol % in $Na_2SrSi_2O_6$ as a host crystal. If the concentration of $Eu^{3+}$ is less than 1 mol %, then luminescence intensity is too weak to be practical. On the other hand, if the quantity of $Eu^{3+}$ more than 80 mol % in concentration is added, no remarkable increase in luminescence intensity is observed.

The fluorescent substance for light-emitting diode of the present invention, as a fluorescent substance comprising a silicate-based matrix, produced by doping $Na_2SrSi_2O_6$ with $Eu^{3+}$ acting as a luminescent ion, has a partially high excitation spectrum due to the $^7F_0 \rightarrow ^6L_6$ transition of $Eu^{3+}$ in the vicinity of 400 nm in the near-ultraviolet region. Accordingly, the fluorescent substance possesses an excellent property as a fluorescent substance to be subjected to the excitation by the ultraviolet light-emitting diode. Thus, by the excitation of the ultraviolet light-emitting diode, the fluorescent substance exhibits emission of comparatively sharp red light with a peak in the vicinity of 600 nm of the spectrum due to the f-f transition of $Eu^{3+}$.

Further, a defect in charge equilibrium caused by doping a site of bivalent $Sr^{2+}$ with trivalent $Eu^{3+}$ is compensated and thus reduced by replacing the site of $Si^{4+}$ in $Na_2SrSi_2O_6$ by $Al^{3+}$ and/or $Ga^{3+}$, thereby drastically increasing the luminescence intensity. In this case, from a standpoint of charge compensation, it is desirable that the site of $Si^{4+}$ be replaced by $Al^{3+}$ and/or $Ga^{3+}$ having the same molar quantity as the doping amount of $Eu^{3+}$.

Hence, according to the fluorescent substance for a light-emitting diode of the present invention, there can be provided a novel fluorescent substance for a light-emitting diode which emits light in the red region of the spectrum by the excitation of the ultraviolet light-emitting diode.

In the meantime, the present invention should not be limited to the forgoing embodiment but various modifications are possible without departing from the scope of the concept of the present invention.

Next is a description of an example of the fluorescent substance for a light-emitting diode, which is produced by doping $Na_2SrSi_2O_6$ with $Eu^{3+}$, according to the present invention.

$Na_2CO_3$, $SrCO_3$, $SiO_2$ and $Eu_2O_3$ were used as starting raw materials and $NH_4Cl$ as a flux, and then these materials and the flux were each weighed so that $Eu^{3+}$ in the mixture of these materials and flux accounted for 1 to 80 mol % in concentration. The mixture was allowed to undergo a chemical reaction at 900 degrees C. in the ambient air and for 48 hours, using an ordinary solid reaction method. Besides, since the site of $Sr^{2+}$ was replaced by $Eu^{3+}$, the site of $Si^{4+}$ was replaced by the same amount of $Al_2O$, $Ga_2O_3$ as that of $Eu^{3+}$ in order to make charge compensation, and then the resultant substance was baked under the same conditions as described above. A powder X-ray diffraction and a fluorescence spectrometer were used for the identification of the samples and for the evaluation of the fluorescence property, respectively.

The resultant powder X-ray diffraction when doped with 1 mol % of $Eu^{3+}$ is shown in FIG. 1. As the result of the baking within a temperature range of from 800 to 1,050 degrees C., single-phase $Na_2SrSi_2O_6$ could be synthesized at 900 degrees C.

Further, it could be verified that for the luminance property of the obtained samples, they had partially high excitation spectra due to the $^7F_0 \rightarrow ^5L_6$ transition of $Eu^{3+}$ in the near-ultraviolet region in the vicinity of 400 nm of the spectrum and hence the obtained samples could be used as a red fluorescent substance to be excited by an ultraviolet light-emitting diode. It was observed that the emitted light had a sharp spectrum resulting from the f-f transition of $Eu^{3+}$ in the vicinity of 600 nm of the spectrum and the luminescent color was a red one containing rich orange components.

In a case where a bivalent site is replaced by a trivalent ion as described above, i.e., the site of $Sr^{2+}$ is doped with $Eu^{3+}$, a defect from a standpoint of charge equilibrium occurs and such defect is considered to act as a non-radiant center. Accordingly, an attempt was made to improve the luminance intensity by replacing, as the charge compensation, the site of $Sr^{4+}$ by $Al^{3+}$ and $Ga^{3+}$ of the same molar quantity as the doping of $Eu^{3+}$.

Figure 2:
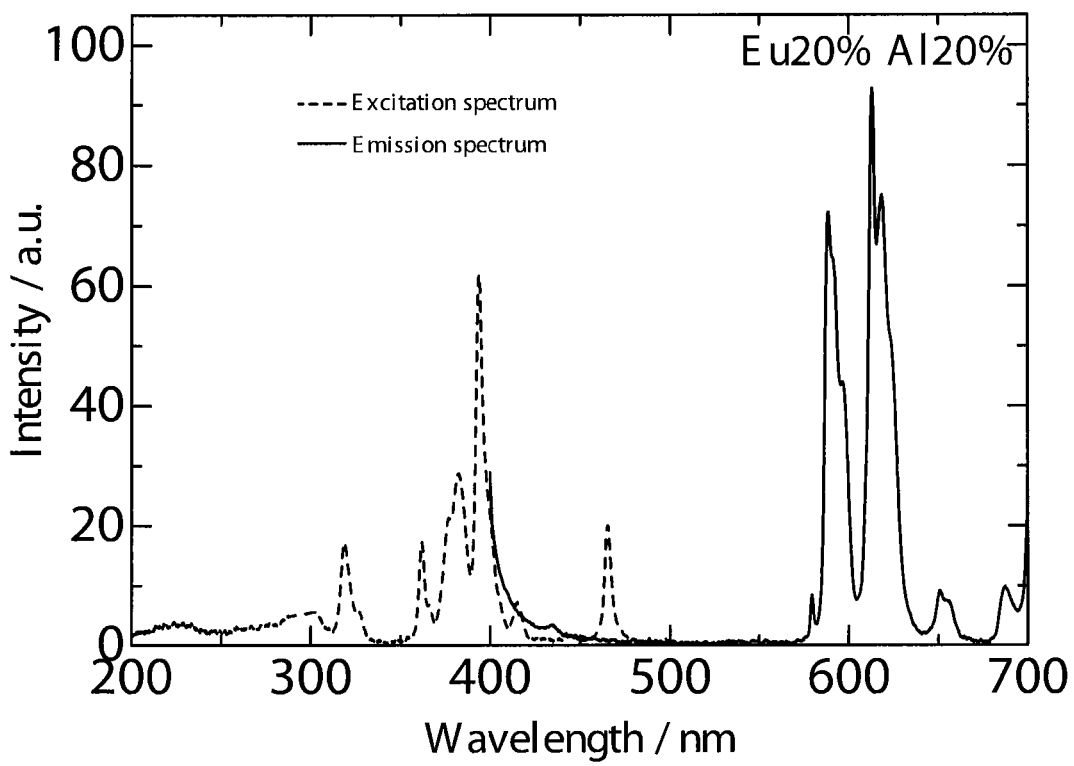
FIG. 2 is an excitation emission spectrum of $Na_2SrSi_2O_6$:$Eu^{3+}$—$Al^{3+}$ according to the present invention.

FIG. 2 shows an excitation luminance spectrum of a sample which was doped with 20 mol % of $Eu^3$ and of which the site of $Sr^{4+}$ was replaced by 20 mol % of $Al^{3+}$ as the charge compensation. In the sample that underwent such charge compensation, the luminance intensity about 2.5 times as large as that of the sample that underwent no charge compensation was observed, thus verifying that the defect was reduced by the charge compensation.

Embodiment 2

A second fluorescent substance for a light-emitting diode according to the present invention is produced by doping a host crystal having a rankinaite structure with $Ce^{3+}$ and $Tb^{3+}$.

The term "rankinaite structure" means a crystal structure identical to that of the rankinaite $Ca_3Si_2O_7$, and this may be one where sites of Ca in $Ca_3Si_2O_7$ are replaced by Sr, Ba or the like, or also may be one where part of sites of Si is replaced by Al, Ge, P or the like. As the host crystal with the rankinaite structure, rankinaite $Ca_3Si_2O_7$ is preferably employed.

Besides, $Ce^{3+}$ and $Tb^{3+}$ are preferably added so as to account for 0.1 to 5 mol % and 0.1 to 20 mol % in concentration in the host crystal, respectively. In the meantime, if $Ce^{3+}$ and $Tb^{3+}$ less than 0.1 mol % in concentration are added, luminescence intensity becomes too weak to be practical. On the other hand, if the quantity of $Ce^{3+}$ more than 5 mol % in concentration and $Tb^{3+}$ more than 20 mol % in concentration are added, no remarkable increase in luminance intensity is observed.

As a fluorescent substance comprising an alkaline-earth silicate matrix, the fluorescent substance for a light-emitting diode of the present invention, produced by doping the rankinaite with $Ce^{3+}$ and $Tb^{3+}$ as luminescent ions, has an excitation spectrum of $Ce^{3+}$ in the near-ultraviolet light region of 300 to 400 nm. Therefore, the fluorescent substance possesses an excellent property as a fluorescent substance to be excited by the ultraviolet light-emitting diode. When $Ce^{3+}$ is excited by the ultraviolet light-emitting diode, then an energy transmission from $Ce^{3+}$ to $Tb^{3+}$ allows $Tb^{3+}$ to emit light. This emitted light of $Tb^{3+}$ exhibits comparatively sharp green light emission with the most intense peak in the vicinity of 550 nm. Thus, by a coactivation using energy transmission from $Ce^{3+}$ to $Tb^{3+}$, intense emitted light from $Tb^{3+}$ can be obtained. In the meantime, such coactivation is referred to as fluorescence enhancement.

Hence, according to the fluorescent substance for a light-emitting diode in the present invention, there can be provided a novel fluorescent substance for a light-emitting diode which emits light in the green region of the spectrum by the excitation of the ultraviolet light-emitting diode.

In the meantime, the present invention should not be limited to the forgoing embodiment but various modifications are possible without departing from the scope of the concept of the present invention.

Next is a description of an example of the fluorescent substance for a light-emitting diode, which is produced by doping $Ca_3Si_2O_7$ with $Ce^{3+}$ and $Tb^{3+}$ according to the present invention.

$Ca_3Si_2O_7$ was synthesized by an ordinary solid-phase method. In order to prepare an initial raw material for respective samples, $CaCO_3$, $SiO_2$, $CeO_2$ and $Tb_4O_7$, as starting raw materials, were weighed so that the concentrations of $Ce^{3+}$ and $Tb^{3+}$ as rare earth ions might account for 0.1 to 5 mol % and 1 to 20 mol % in the mixture thereof, respectively. Then, acetone was added to the mixture and then each sample was subjected to wet blending within an agate mortar. After having dried the samples, they were baked for 6 hours at 1,200 degrees C. in the ambient air. After the baking, each of the samples was ground and subjected to reduction firing for 6 hours at 1,300 degrees C. in a reduction atmosphere. It was verified from the result of the measurement by the powder X-ray diffraction that $Ce^{3+}$ and $Tb^{3+}$ formed a solid solution at the sites of Ca, so that a single-phase target substance was obtained.

Figure 3:
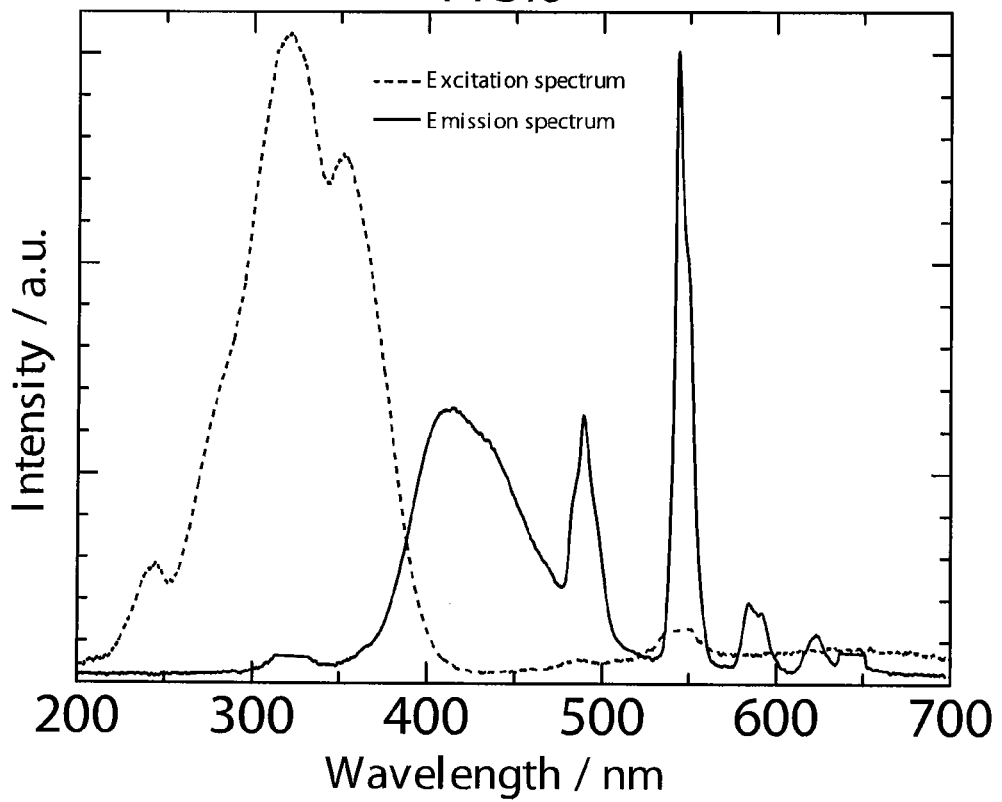
FIG. 3 is an excitation emission spectrum of $Ca_3Si_2O_7$:$Ce^{3+}$—$Tb^{3+}$ according to the present invention.

FIG. 3 shows an excitation emission spectrum of $Ca_3Si_2O_7:Ce^{3+}$—$Tb^{3+}$ that was synthesized in the present example. It was verified that the obtained sample had an extremely excellent property as a fluorescent substance to be excited by the ultraviolet light-emitting diode because a broad excitation spectrum existed in the near-ultraviolet light region of 300 to 400 nm. The emitted light of $Tb^{3+}$ was comparatively sharp green, having the most intense peak in the vicinity of 550 nm of the spectrum. Besides, somewhat weak emitted light of $Tb^{3+}$ was observed in the vicinity of 500 nm and 580 nm as well, while comparatively broad emitted light of $Ce^{3+}$ was observed in the vicinity of 400 nm.

Embodiment 3

A third fluorescent substance for a light-emitting diode according to the present invention is produced by doping a host crystal having a rankinaite structure with $Eu^{2+}$.

The term "rankinaite structure" means a crystal structure identical to that of the rankinaite $Ca_3Si_2O_7$, and this may be one where sites of Ca in $Ca_3Si_2O_7$ are replaced by Sr, Ba or the like, or also may be one where part of sites of Si is replaced by Al, Ge, P or the like. As the host crystal with the rankinaite structure, rankinaite $Ca_3Si_2O_7$ is preferably employed.

Besides, $Eu^{2+}$ is preferably added so as to account for 5 to 10 mol % in concentration in the host crystal. In the meantime, if $Eu^{2+}$ less than 0.5 mol % in concentration is added, luminescence intensity becomes too weak to be practical. On the other hand, if the quantity of $Eu^{2+}$ more than 10 mol % in concentration is added, no remarkable increase in luminescence intensity is observed.

As a fluorescent substance comprising an alkaline-earth silicate matrix, the fluorescent substance for a light-emitting diode of the present invention, produced by doping the rankinaite with $Eu^{2+}$ as a luminescent ion, has an excitation spectrum in the visible light region of 400 to 500 nm. Therefore, it has an excellent property as a fluorescent substance to be excited by a blue light-emitting diode, and it exhibits emission of a comparatively broad range of red light with a peak in the vicinity of 600 nm caused by the excitation by the blue light-emitting diode.

Hence, according to the fluorescent substance for a light-emitting diode of the present invention, there can be provided a novel fluorescent substance for a light-emitting diode which emits light in the red region of the spectrum by the excitation by the blue light emitting diode.

In the meantime, the present invention should not be limited to the forgoing embodiments but various modifications are possible without departing from the scope of the concept of the present invention.

Next is a description of an example of the fluorescent substance for a light-emitting diode, which is produced by doping $Ca_3Si_2O_7$ with $Eu^{2+}$ according to the present invention.

$Ca_3Si_2O_7$ was synthesized by an ordinary solid-phase method. In order to prepare an initial raw material for respective samples, $CaCO_3$, $SiO_2$ and $Eu_2O_3$ as starting raw materials were weighed so that the concentration of $Eu^{2+}$ as a rare earth ion might account for 0.5 to 10 mol % in the mixture thereof. Then, acetone was added to the mixture and then each sample was subjected to wet blending within an agate mortar. After having dried the samples, they were baked for 6 hours at 1,300 degrees C. in the ambient air. After the baking, each of the samples was ground and subjected to reduction firing for 6 hours at 1,300 degrees C. in a reduction atmosphere. It was verified from the result of the measurement by the powder X-ray diffraction that $Eu^{2+}$ formed a solid solution at the sites of Ca, so that a single-phase target substance was obtained under the foregoing synthesizing condition.

Figure 4:
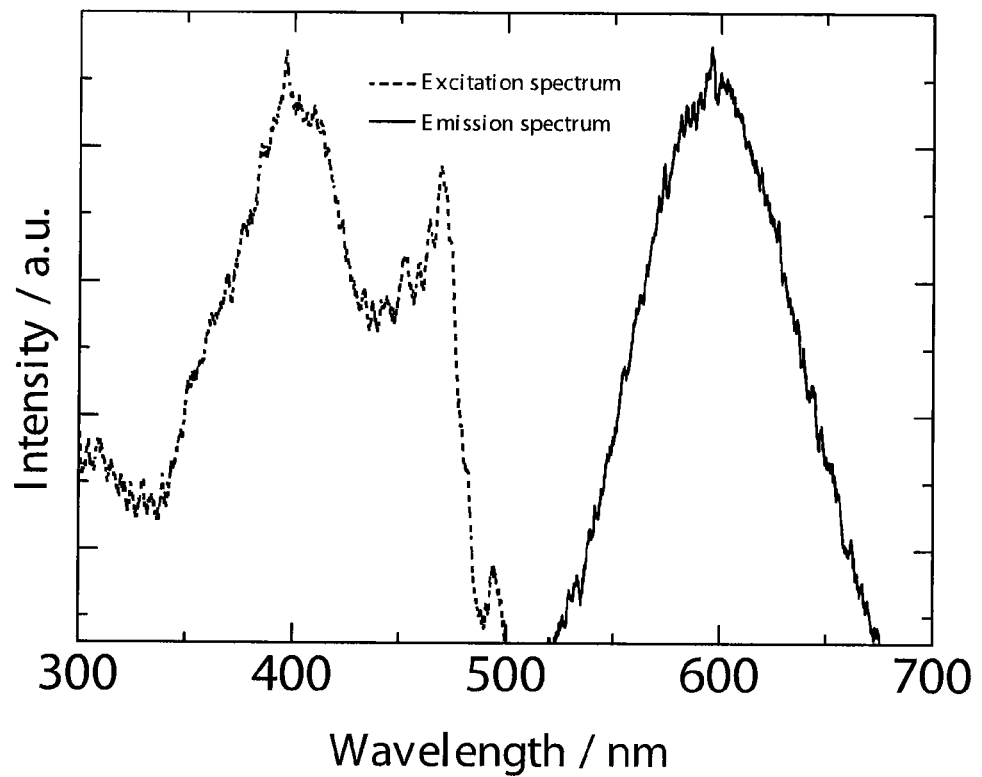
FIG. 4 is an excitation emission spectrum of $Ca_3Si_2O_7$:$Eu^{2+}$ according to the present invention.

FIG. 4 shows an excitation emission spectrum of $Ca_2Si_2O_7:Eu^{2+}$ that was synthesized in the present example. Whilst a fluorescent substance to be excited by a blue light-emitting diode is required to absorb blue light, it was verified that the obtained sample had an extremely excellent property as a fluorescent substance to be excited by the blue light-emitting diode because a broad excitation spectrum existed in the blue visible light region of 400 to 500 nm. The emitted light thereof was in a comparatively broad range of red light with a peak in the vicinity of 600 nm.

The invention claimed is:

1. The fluorescent substance for a light-emitting diode, wherein said fluorescent substance is produced by doping $Na_2SrSi_2O_6$ with $Eu^{3+}$ and has a $Eu^{3+}$ concentration of from 1 to 80 mol %.

2. The fluorescent substance for a light-emitting diode, wherein said fluorescent substance is produced by doping $Ca_3Si_2O_7$ with $Ce^{3+}$ and $Tb^{3+}$ has a $Ce^{3+}$ concentration of 0.1 to 5 mol % and a $Tb^{3+}$ concentration of 0.1 to 20 mol %.

3. The fluorescent substance for a light-emitting diode, wherein said fluorescent substance is produced by doping $Ca_3Si_2O_7$ with $Eu^{2+}$ has a $Eu^{2+}$ concentration of 0.5 to 10 mol %.

4. The fluorescent substance for a light-emitting diode according to claim 1, wherein sites of $Si^{4+}$ in $Na_2SrSi_2O_6$ are replaced by $Al^{3+}$ and/or $Ga^{3+}$ having the same molar quantity as the doping amount of $Eu^{3+}$.

* * * * *